United States Patent
Nagata et al.

(10) Patent No.: US 11,819,888 B2
(45) Date of Patent: Nov. 21, 2023

(54) OPTICAL DEVICE AND OPTICAL UNIT INCLUDING OPTICAL DEVICE

(71) Applicant: Murata Manufacturing Co., Ltd., Nagaokakyo (JP)

(72) Inventors: Masaki Nagata, Nagaokakyo (JP); Yasuhiro Shimizu, Nagaokakyo (JP); Kenji Nishiyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 602 days.

(21) Appl. No.: 17/108,035

(22) Filed: Dec. 1, 2020

(65) Prior Publication Data
US 2021/0080619 A1   Mar. 18, 2021

Related U.S. Application Data

(63) Continuation of application No. PCT/JP2020/009611, filed on Mar. 6, 2020.

(30) Foreign Application Priority Data

Jun. 10, 2019 (JP) .................................. 2019-108157

(51) Int. Cl.
*B60S 1/56* (2006.01)
*G02B 27/00* (2006.01)
(Continued)

(52) U.S. Cl.
CPC .................. *B08B 7/02* (2013.01); *B60S 1/56* (2013.01); *C09K 3/18* (2013.01); *G02B 27/0006* (2013.01);
(Continued)

(58) Field of Classification Search
None
See application file for complete search history.

(56) References Cited

U.S. PATENT DOCUMENTS

| 2018/0335505 A1 | 11/2018 | Bretagnol et al. |
| 2020/0039475 A1 | 6/2020 | Ichiguchi et al. |

FOREIGN PATENT DOCUMENTS

| JP | 2009-265473 A | 11/2009 |
| JP | 2015-018106 A | 1/2015 |

(Continued)

OTHER PUBLICATIONS

Official Communication issued in International Patent Application No. PCT/JP2020/009611, dated Jun. 2, 2020.

*Primary Examiner* — Derek S. Chapel
(74) *Attorney, Agent, or Firm* — KEATING & BENNETT, LLP (57) ABSTRACT

An optical device includes a protective cover and a driver. An outer surface of the protective cover includes a first region having higher hydrophobicity than a second region. The first region is separated from the second region by a first boundary line extending from a starting point deviating from a center point of the protective cover in the direction toward an outer edge portion of the protective cover and a second boundary line extending from the starting point in the direction toward the outer edge portion of the protective cover, and which is located on a side where the center point is not included. Among angles defined by the first and second boundary lines, an angle on the side where the center point is not included is equal to or less than about 180°.

20 Claims, 7 Drawing Sheets

(51) Int. Cl.
  *G03B 17/02* (2021.01)
  *H04N 23/55* (2023.01)
  *G03B 17/08* (2021.01)
  *G02B 1/18* (2015.01)
  *B08B 7/02* (2006.01)
  *H04N 23/50* (2023.01)
  *H10N 30/20* (2023.01)
  *C09K 3/18* (2006.01)
  *H04N 23/52* (2023.01)

(52) U.S. Cl.
  CPC ............. *G03B 17/02* (2013.01); *G03B 17/08* (2013.01); *H04N 23/50* (2023.01); *H04N 23/52* (2023.01); *H04N 23/55* (2023.01); *H10N 30/20* (2023.02); *G02B 1/18* (2015.01)

(56) References Cited

FOREIGN PATENT DOCUMENTS

| | | |
|---|---|---|
| JP | 2019-032505 A | 2/2019 |
| WO | 2018/198464 A1 | 11/2018 |

OPTICAL DEVICE AND OPTICAL UNIT INCLUDING OPTICAL DEVICE

CROSS REFERENCE TO RELATED APPLICATIONS

This application claims the benefit of priority to Japanese Patent Application No. 2019-108157 filed on Jun. 10, 2019 and is a Continuation Application of PCT Application No. PCT/JP2020/009611 filed on Mar. 6, 2020. The entire contents of each application are hereby incorporated herein by reference.

BACKGROUND OF THE INVENTION

1. Field of the Invention

The present invention relates to an optical device and an optical unit including the optical device.

2. Description of the Related Art

In recent years, an optical unit including an optical sensor such as an imaging element or the like is provided in a front portion or a rear portion of a vehicle, and a safety device is controlled or automatic operation control is performed by using an image obtained by the optical unit. Since the optical unit as described above is provided outside the vehicle in many cases, foreign matter such as raindrops, mud, dust, and the like may adhere to a light-transmitting body (a lens and a protective cover) that covers the outside thereof. When the foreign matter adheres to the light-transmitting body, the foreign matter adhering thereto is reflected in the image obtained by the optical unit, and a clear image cannot be obtained.

Accordingly, in an optical unit disclosed in Japanese Unexamined Patent Application Publication No. 2015-18106, a configuration is disclosed in which, in order to easily remove foreign matter such as water droplets and the like adhering to a surface of a light-transmitting body and prevent adhesion of dirt to the light-transmitting body while achieving space saving, a hydrophilic coating and a water-repellent coating are applied to the surface of the light-transmitting body. In particular, the optical unit disclosed in Japanese Unexamined Patent Application Publication No. 2015-18106 has at least two boundary lines for dividing a region of the hydrophilic coating and a region of the water-repellent coating, and end portions of the boundary lines are matched in the vicinity of an intersection point which is the lowest point of the gravity of the light-transmitting body.

However, in the optical unit disclosed in Japanese Unexamined Patent Application Publication No. 2015-18106, since the two boundary lines are matched in the vicinity of the intersection point which is the lowest point of the light-transmitting body, the water droplets adhering to the surface of the light-transmitting body cannot be removed as smoothly as expected. In particular, in the case where the optical unit has a rotation mechanism for removing water droplets adhering to the surface of the light-transmitting body by rotating the light-transmitting body, the water droplets flow from the center of the light-transmitting body to an outer edge portion when the light-transmitting body is rotated, and the water droplets do not always collect at the lowest point of the gravity assumed in Japanese Unexamined Patent Application Publication No. 2015-18106.

SUMMARY OF THE INVENTION

Preferred embodiments of the present invention provide optical devices and optical units each including an optical device that are each capable of easily removing foreign matter adhering to a light-transmitting body.

An optical device according to a preferred embodiment of the present invention includes a light-transmitting body disposed in a direction of a visual field of an optical sensor; and a driver to rotationally drive the light-transmitting body along an axis in the visual field of the optical sensor, in which a first region and a second region having higher hydrophobicity than the first region are provided on an outer surface of the light-transmitting body, the second region is separated from the first region by a first boundary line extending from a first starting point deviating from a rotation center of the light-transmitting body in a direction toward an outer edge portion of the light-transmitting body and a second boundary line extending from the first starting point in a direction toward the outer edge portion of the light-transmitting body, and is located on a side at which the rotation center is not included, and among angles defined by the first boundary line and the second boundary line, an angle on the side where the rotation center is not included is equal to or less than about 180°

An optical unit according to a preferred embodiment of the present invention includes an optical sensor and an optical device according to a preferred embodiment of the present invention.

According to preferred embodiments of the present invention, since a second region, which is separated by a first boundary line and a second boundary line, having higher hydrophobicity than a first region is provided on a side where the rotation center is not included, driving the light-transmitting body makes it possible to easily remove foreign matter adhering to a light-transmitting body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, optical units according to preferred embodiments of the present invention will be described in detail with reference to the drawings. Note that the same reference numerals in the drawings denote the same or corresponding portions.

Preferred Embodiment 1

Figure 1:
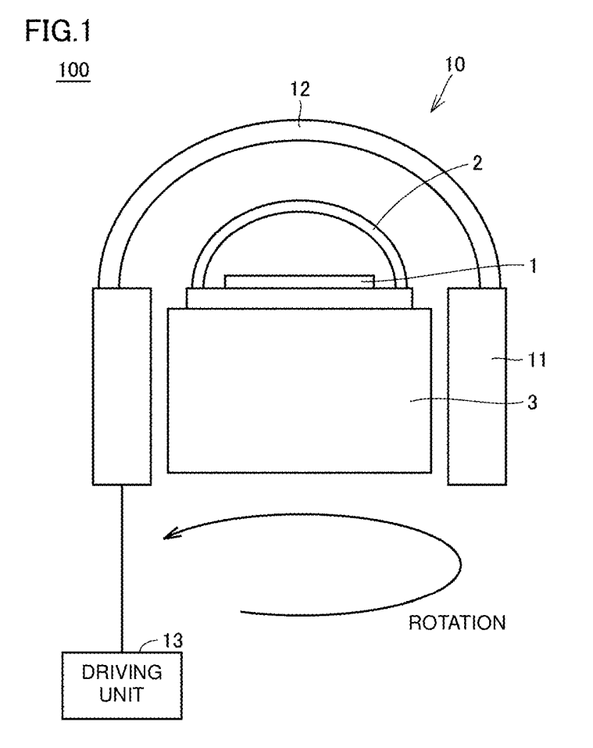
FIG. 1 is a schematic diagram for describing the configuration of an optical unit according to Preferred Embodiment 1 of the present invention.

Hereinafter, an optical unit according to Preferred Embodiment 1 of the present invention will be described with reference to the drawings. FIG. 1 is a schematic diagram for describing the configuration of an optical unit 100 according to Preferred Embodiment 1. The optical unit 100 is, for example, a unit that is attached to the front, rear, or the like of a vehicle, and acquires information such as a shape, a color, a temperature, and the like of an object and information such as a distance to the object or the like. The optical unit 100 includes an optical sensor 1 to acquire information such as, for example, a shape, a color, a temperature, and the like of an object and information such as a distance to the object or the like, and an optical device 10 that holds the optical sensor 1 and includes an optical member and the like to guide light to a sensor surface of the optical sensor 1. The location at which the optical unit 100 is attached is not limited to the vehicle, and it may be attached to another apparatus such as a ship, an aircraft, or the like, for example.

In the case where the optical unit 100 is attached to the vehicle or the like and used outdoors, foreign matter such as raindrops, mud, dust, and the like, for example, adhere to a light-transmitting body (a lens and a protective cover) that is disposed in a visual field direction of the optical sensor 1 and covers the outside thereof in some cases. Accordingly, the optical device 10 is provided with a remover to remove the foreign matter adhering to the light-transmitting body.

Specifically, the optical device 10 includes a lens 2 that guides light to the sensor surface of the optical sensor 1, a holding portion 3 that holds the optical sensor 1 and the lens 2, a housing 11, a transparent protective cover (light-transmitting body) 12 that is provided on one surface of the housing 11 and located in an outer side portion of the lens 2, and a driver 13 that rotates the protective cover 12. The driver 13 includes a motor (not illustrated), and rotates the protective cover 12 with respect to the holding portion 3 by driving the housing 11 with the motor. That is, the driver 13 is a rotation mechanism of the protective cover 12, and is a remover that removes foreign matter adhering to the surface of the protective cover 12 by centrifugal force. Note that the holding portion 3 that holds the optical sensor 1 and the lens 2 is fixed to the vehicle or the like to which it is attached.

The housing 11 preferably has a cylindrical or substantially cylindrical shape, and is made of, for example, a metal or a synthetic resin. Note that the housing 11 may have another shape such as a prism shape or the like, for example.

The protective cover 12 is provided on one end side of the housing 11, and the driver 13 is connected to the other end side.

The protective cover 12 has a dome shape extending from the one end of the housing 11. In Preferred Embodiment 1, the dome shape is assumed to be a hemispherical shape. Note that the optical sensor 1 preferably has, for example, a visual field angle of about 170°. However, the dome shape is not limited to the hemispherical shape. A shape in which a cylinder is coupled to the hemisphere, a curved surface shape smaller than the hemisphere, or the like, for example, may be provided. The protective cover 12 may be a flat plate. The protective cover 12 has a light-transmitting property so as to transmit at least light having a target wave length of the optical sensor 1. Accordingly, it does not matter whether the light transmitted through the protective cover 12 is visible light or invisible light.

In Preferred Embodiment 1, the protective cover 12 is preferably made of glass, for example. However, the material is not limited to glass, and it may be made of a resin such as a transparent plastic or the like, for example. Alternatively, it may be made of a light-transmitting ceramic material. However, depending on the application, it is preferable to use tempered glass. This makes it possible to improve the strength. In the case of the resin, as the material of the protective cover 12, acrylic, cycloolefin, polycarbonate, polyester, or the like, for example, may be used. Furthermore, a coating layer made of DLC or the like, for example, may be provided on the surface of the protective cover 12 in order to improve the strength. Additionally, as will be described later, on the surface of the protective cover 12 according to Preferred Embodiment 1, a coating layer, such as a hydrophilic film, a water-repellent film, a lipophilic film, an oil-repellent film, or the like cycloolefin, having different hydrophobicity is provided.

The protective cover 12 may be a simple cover made of glass, or may be an optical component such as a concave lens, a convex lens, a plane lens, or the like, for example. The lens 2 is further included in an inner side portion of the protective cover 12. A bonding method between the protective cover 12 and the housing 11 is not particularly limited. The protective cover 12 and the housing 11 may be bonded to each other by an adhesive, welding, fitting, press-fitting, or the like, for example.

The optical sensor 1 described above is disposed in the protective cover 12. The optical sensor 1 may be, for example, an image sensor such as CMOS (Complementary MOS), CCD (Charge-Coupled Device), or the like, or may be, for example, LiDAR (Light Detection and Ranging) using a laser, or the like. In the case where the image sensor is used for the optical sensor 1, the optical sensor 1 photographs an object to be imaged in the outside through the lens 2 and the protective cover 12.

The lens 2 has a dome shape extending from one end of the holding portion 3. In Preferred Embodiment 1, the dome shape is assumed to be a hemispherical shape. Note that the lens 2 may be a flat plate. The lens 2 has a light-transmitting property so as to transmit at least light having a target wave length of the optical sensor 1. Accordingly, it does not matter whether the light transmitted through the lens 2 is visible light or invisible light.

The lens 2 is preferably an optical component such as a concave lens, a convex lens, a plane lens, or the like, for example, but may be a simple cover made of glass. An optical component may further be included in the inner side portion of the lens 2. A bonding method between the lens 2 and the holding portion 3 is not particularly limited. The lens 2 and the holding portion 3 may be bonded to each other by an adhesive, welding, fitting, press-fitting, or the like, for example.

In Preferred Embodiment 1, the lens 2 is preferably made of glass, for example. However, the material is not limited to glass, and it may be made of a resin such as a transparent plastic or the like, for example. Alternatively, it may be made of a light-transmitting ceramic material. Furthermore, a coating layer made of DLC or the like, for example, may be provided on the surface of the lens 2 in order to improve the strength, and for the purpose of protecting the surface from dirt, a coating layer, such as a hydrophilic film, a water-repellent film, a lipophilic film, an oil-repellent film, or the like, for example, may be provided.

The holding portion 3 has a circular or substantially circular column shape, and is preferably made of, for example, a metal or a synthetic resin. Note that the holding portion 3 may have another shape such as a prism shape or the like, for example. The optical sensor 1 and the lens 2 are held on one end side of the holding portion 3.

In the optical device 10, as a remover to remove the foreign matter adhering to the protective cover 12, a rotation mechanism to rotate the protective cover 12 is used. In the case where the foreign matter adhering to the protective cover 12 is removed by using the rotation mechanism, when the protective cover 12 is rotated, a movement distance of the protective cover 12 on an outer edge portion side is long, and a movement distance on the center portion side is short. That is, in the protective cover 12, the centrifugal force applied to the center portion side becomes smaller than the centrifugal force applied to the outer edge portion side, and therefore the water droplet adhering to the protective cover 12 flows from the center portion side toward the outer edge portion side of the protective cover.

Figure 2:
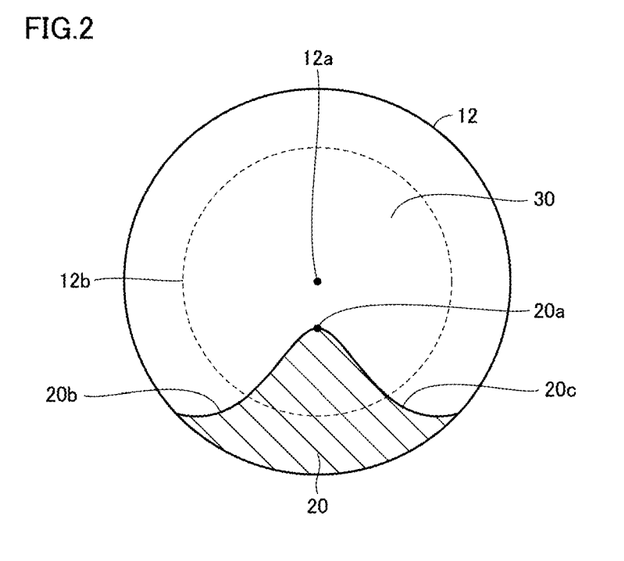
FIG. 2 is a plan view illustrating a region having different hydrophobicity provided on a protective cover according to Preferred Embodiment 1 of the present invention.

Accordingly, in the optical device 10 according to Preferred Embodiment 1, by utilizing the fact that the foreign matter (for example, a water droplet) adhering to the protective cover 12 flows from the center portion side to the outer edge portion side of the protective cover when the protective cover 12 is rotated, a region having different hydrophobicity is provided such that the foreign matter can be easily removed. FIG. 2 is a plan view illustrating a region having different hydrophobicity provided on the protective cover 12 according to Preferred Embodiment 1. FIG. 2 is a plan view of the protective cover 12 illustrated in FIG. 1 when viewed from an upper side in the diagram.

As illustrated in FIG. 2, on the surface of the protective cover 12, a boundary with a region having different hydrophobicity is present, and boundary lines thereof pass through from a position (starting point 20a) that is different from a center point 12a of the protective cover 12 in a direction toward the outer edge portion via an inner circumferential portion 12b. And of the regions having different hydrophobicity, a region 20 having high hydrophobicity is on a side where the center point 12a of the protective cover 12 is not included. Here, the center point 12a of the protective cover 12 substantially coincides with the rotation center of the protective cover 12. It is sufficient that the rotation center of the protective cover 12 is a point in the visual field of the optical sensor 1. Furthermore, the inner circumferential portion 12b is a visual field region at the protective cover 12 corresponding to the visual field of the optical sensor 1. The starting point 20a (first starting point) is located in the inner circumferential portion 12b, and an outer circumferential portion is provided in an outer side portion of the inner circumferential portion 12b.

More specifically, the surface of the protective cover 12 is provided with the region 20 (second region) having higher hydrophobicity than another region 30 (first region). This region 20 is separated from the other region 30 by a boundary line 20b (first boundary line) extending from the starting point 20a deviating from the center point 12a (rotation center) of the protective cover 12 in a direction toward the outer edge portion of the protective cover 12 and a boundary line 20c (second boundary line) extending from the starting point 20a in a direction toward the outer edge portion of the protective cover 12, and which is located on a side where the center point 12a is not included. Furthermore, on the surface of the protective cover 12, with respect to a line segment that extends from the center point 12a of the protective cover 12 through the starting point 20a, the boundary line 20b is provided on one side and the boundary line 20c is provided on the other side. Furthermore, in the region 20, among angles defined by the boundary line 20b and the boundary line 20c, the angle on the side where the center point 12a is not included is equal to or less than about 180°.

In the region 20 illustrated in FIG. 2, the boundary line 20b and the boundary line 20c are curved lines. Accordingly, the angle formed the boundary line 20b and the boundary line 20c at the starting point 20a can be defined as, for example, an angle formed by a first straight line connecting a point of intersection between the boundary line between the inner circumferential portion 12b and the outer circumferential portion and the boundary line 20b and the starting point 20a, and a second straight line connecting a point of intersection between the boundary line between the inner circumferential portion 12b and the outer circumferential portion and the boundary line 20c and the starting point 20a. Note that the angle formed by the boundary line 20b and the boundary line 20c may be defined, using another method, for example, in which the angle is defined by approximating the boundary lines 20b and 20c, which are curved lines, as straight lines. In the region 20 illustrated in FIG. 2, of the angles defined by the boundary line 20b and the boundary line 20c at the starting point 20a, the angle on the side where the center point 12a is not included is an acute angle. Note that it is sufficient that the boundary line 20b and the boundary line 20c are provided at least in the inner circumferential portion 12b.

The region 20 can be provided by applying a coating material having high hydrophobicity to the surface of the protective cover 12. The coating material having high hydrophobicity is roughly divided into a fluorine-based material and a silicone-based material. Examples of the fluorine-based coating material include, for example, a material including a compound having a perfluoroalkyl group (a group in which H of the alkyl group is replaced by F) as a main component, and a material including a compound having a perfluoroalkyl group as a main component. Note that specific examples of the fluorine-based coating material are described in detail in, for example, Japanese Unexamined Patent Application Publication No. 2019-52195, and the like. Examples of the silicone-based coating material include a material having a portion where a main chain portion is formed of direct coupling of silicon (Si) and oxygen (O). Note that specific examples of the silicone-based coating material are described in detail in, for example, Japanese Unexamined Patent Application Publication No. 2002-356651, and the like.

The coating material may not be applied to the other region 30, but a coating material having lower hydrophobicity than that of the region 20 may be applied thereto.

Examples of the coating material having low hydrophobicity, that is, a coating material having high hydrophilicity include a monomer or a polymer having a hydrophilic group represented by a hydroxyl group (—OH), a carboxyl group (—COOH), and an amino group (—NH), and the like. Specific examples of the coating material having high hydrophilicity of an organic material are described in detail in, for example, Japanese Unexamined Patent Application Publication No. 2019-44010, and the like. Furthermore, the coating material having high hydrophilicity is not limited to an organic material, and may be an inorganic material. By coating the surface of the protective cover 12 with a coating material of an inorganic material by using an etching treatment, a plasma treatment, or the like, for example, a region having high hydrophilicity may be provided on the surface of the protective cover 12. Furthermore, for example, a region having high hydrophilicity may be formed by performing ozone treatment on the surface of the protective cover 12, or a region having high hydrophilicity may be formed by coating with a photocatalyst such as titanium oxide or the like.

Conversely, by applying a coating material having low hydrophobicity to the other region 30 without applying a coating material to the region 20, the region 20 may have higher hydrophobicity than the other region 30.

By providing a region having different hydrophobicity such as the region 20 on the surface of the protective cover 12, when an external force (for example, centrifugal force, wind force) that may cause the water droplet to move from the region side having high hydrophilicity to the region side having high hydrophobicity is applied thereto, an effect is obtained in which the water droplet is accumulated and grows on the region side having higher hydrophilicity of the boundary line. This effect makes it possible to easily remove the water droplet adhering to the surface of the protective cover 12.

Specifically, when a water droplet adheres to the protective cover 12 illustrated in FIG. 2, the adhering water droplet gradually moves from the center portion to the outer edge portion by the centrifugal force by the rotation of the protective cover 12. The water droplet moving on the surface of the protective cover 12 by the centrifugal force is, when approaching the boundary lines 20b and 20c, without entering the region 20 having high hydrophobicity, accumulated in the region with high hydrophilicity in front of the region 20 and grows largely. In the largely grown water droplet, since the diameter of the water droplet is large, the value of (the contact area between the water droplet and the protective cover 12)/(the volume of the water droplet) becomes smaller than that of a small water droplet, and the surface tension is also reduced. The water droplet accumulated in the region having high hydrophilicity in front of the region 20 by the surface tension is, when increasing in size, by decrease in surface tension, likely to roll on the surface of the protective cover 12, and easily flows out to the outside of the protective cover 12.

That is, in the case where the region 20 having high hydrophobicity illustrated in FIG. 2 is provided on the surface of the protective cover 12, the boundary lines 20b and 20c are provided between the region 20 having high hydrophobicity and the region having low hydrophilicity. The boundary lines 20b and 20c are provided with angles to a line segment extending in a radiation direction (radial direction with respect to the rotation direction) with respect to the center of the protective cover 12. That is, the boundary lines 20b and 20c are not parallel to the line segment extending in the radiation direction with respect to the center of the protective cover 12. Accordingly, the water droplet does not simply flow along the boundary lines 20b and 20c, but is accumulated at the portions of the boundary lines 20b and 20c.

Furthermore, an end portion of the boundary line 20b extends to the outer side portion of the visual field region (inner circumferential portion 12b) of the protective cover 12, and an end portion of the boundary line 20c extends to the outer side portion of the visual field region (inner circumferential portion 12b) of the protective cover 12, on the side opposite to the end portion of the boundary line 20b with respect to the line segment. Accordingly, the water droplet accumulated in the portions of the boundary lines 20b and 20c can be made to flow out to the outside of the visual field region (inner circumferential portion 12b) of the protective cover 12.

Figure 3:
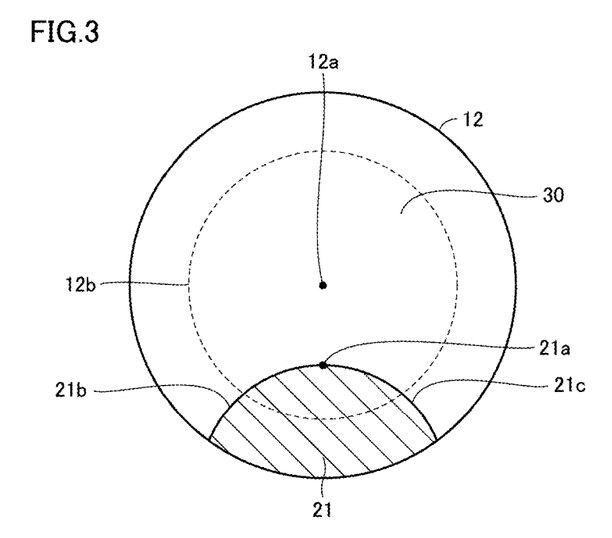
FIG. 3 is a plan view illustrating a region of another shape having different hydrophobicity provided on the protective cover according to Preferred Embodiment 1 of the present invention.

In the region 20 having high hydrophobicity illustrated in FIG. 2, the boundary lines 20b and 20c extending from the starting point 20a to the outer edge portion of the protective cover 12 are curved lines that are recessed to the inner side portion of the region 20. However, the shape is not limited thereto, and the boundary line may be a curved line that is extended to the outer side portion of the region having high hydrophobicity. FIG. 3 is a plan view illustrating a region of another shape having different hydrophobicity provided on the protective cover according to the Preferred Embodiment 1. In a region 21 having high hydrophobicity illustrated in FIG. 3, boundary lines 21b and 21c extending from a starting point 21a to the outer edge portion of the protective cover 12 are curved lines that are projected to the outer side portion of the region 21.

It can be described that the region 21 illustrated in FIG. 3 is a region in which the boundary lines with the other region 30 are curved lines and the curved lines pass through from the inner circumferential portion 12b to the outer circumferential portion of the protective cover 12, and a region which has, when the protective cover 12 is viewed from the front, a projecting single curved line at the inner side portion of the inner circumferential portion 12b and which is located on the projecting side. The region 21 on the projecting side has higher hydrophobicity than the other region 30, and does not include the center point 12a of the protective cover 12. When the protective cover 12 rotates, the water droplet moves in the radial direction from the center of the protective cover 12, but also moves in the tangential direction of the protective cover 12 due to friction with the surface of the protective cover 12 at the same time. Accordingly, when the boundary line between the region 21 and the other region 30 is a curved line, the water droplet moving in the tangential direction can be more efficiently accumulated than a boundary of a straight line.

Figure 4A:
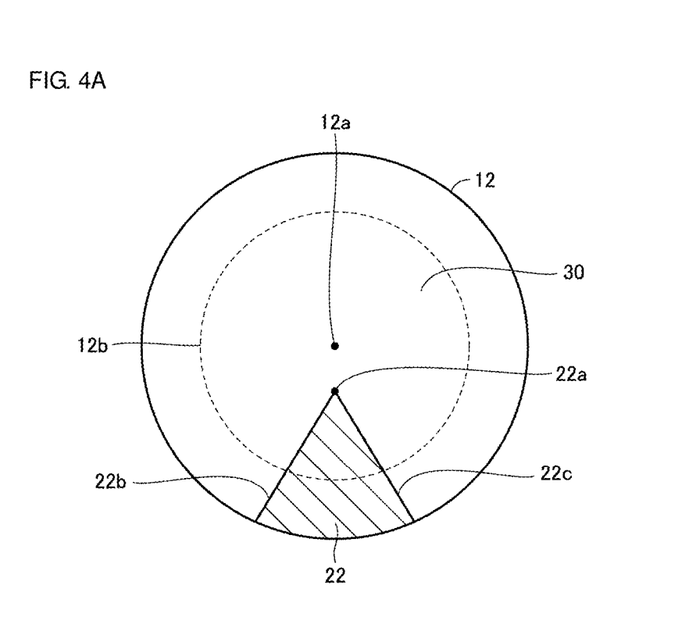
FIGS. 4A and 4B are plan views illustrating a region of still another shape having different hydrophobicity provided on the protective cover according to Preferred Embodiment 1 of the present invention.
Figure 4B:
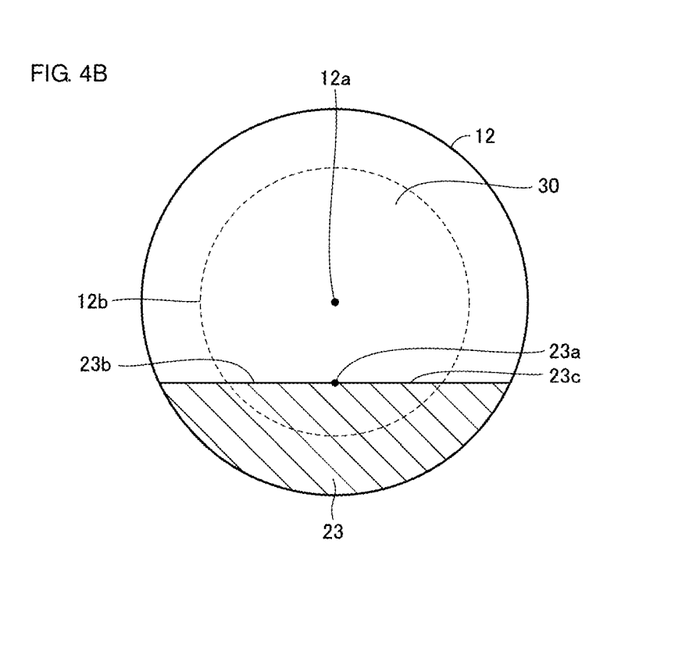

Furthermore, in the region 20 having high hydrophobicity illustrated in FIG. 2, the boundary lines 20b and 20c extending from the starting point 20a to the outer edge portion of the protective cover 12 are curved lines. However, the shape is not limited thereto, and the boundary line may be a straight line. FIGS. 4A and 4B are plan views illustrating a region of another shape having different hydrophobicity provided on the protective cover according to the Preferred Embodiment 1. In a region 22 having high hydrophobicity illustrated in FIG. 4A, boundary lines 22b and 22c extending from a starting point 22a to the outer edge portion of the protective cover 12 are straight lines. In the region 22, of angles defined by the boundary line 22b and the boundary line 22c at the starting point 22a, the angle on the side where the center point 12a is not included is an acute angle. Note that in the region 20 illustrated in FIG. 2 as well, of the angles defined by the boundary line 20b and the boundary line 20c at the starting point 20a, the angle on the side where the center point 12a is not included is an acute angle.

In the region 22 illustrated in FIG. 4A, it can be described that the boundary lines 22b and 22c are defined by two straight lines, the straight lines each include the starting point 22a at the same position in the inner circumferential portion 12b, and the angle on the side where the center point 12a is not included of angles defined by the two straight lines is equal to or less than 180°. The region 22 defined by the two straight lines is a region having high hydrophobicity, and does not include the center of the protective cover 12. In the region 22, since the boundary lines 22b and 22c are each provided at an acute angle with respect to a line segment extending from the center point 12a through the starting point 21a, it becomes easier to more smoothly flow the water droplet to the outer edge portion.

Of the angles defined by the two boundary lines at the starting point, the angle on the side where the center point 12a is not included is not limited to the acute angle. In the region 21 illustrated in FIG. 3, of angles defined by the boundary line 21b and the boundary line 21c at the starting point 21a, the angle on the side where the center point 12a is not included is an obtuse angle. Furthermore, in a region 23 having high hydrophobicity illustrated in FIG. 4B, boundary lines 23b and 23c extending from a starting point 23a to the outer edge portion of the protective cover 12 are straight lines. In the region 23, among angles defined by the boundary line 23b and the boundary line 23c at the starting point 23a, the angle on the side where the center point 12a is not included is about 180°.

In the region 23 illustrated in FIG. 4B, it can be described that the boundary lines 23b and 23c are each defined by a straight line, and the straight lines pass through the inner circumferential portion 12b and the outer circumferential portion of the protective cover 12. The region where the water droplet is accumulated is preferably small so as not to interfere with the visibility of the optical sensor 1.

As described above, the optical device 10 according to Preferred Embodiment 1 includes the protective cover 12 disposed in the visual field direction of the optical sensor 1, and the driver 13 that rotationally drives the protective cover 12 with the center of the visual field of the optical sensor 1 as an axis. The outer surface of the protective cover 12 is provided with the region 20 (second region) having higher hydrophobicity than the other region 30 (first region). The region 20 is separated from the other region 30 by the boundary line 20b (first boundary line) extending from the starting point 20a (first starting point) deviating from the center point 12a (rotation center) of the protective cover 12 in the direction toward the outer edge portion of the protective cover 12 and the boundary line 20c (second boundary line) extending from the starting point 20a in the direction toward the outer edge portion of the protective cover 12, and which is located on the side where the center point 12a is not included. Among the angles defined by the boundary line 20b and the boundary line 20c, the angle on the side where the center point 12a is not included is equal to or less than about 180°.

Accordingly, the optical device 10 according to Preferred Embodiment 1 is provided with the region 20, which is separated by the boundary line 20b and the boundary line 20c, having higher hydrophobicity than the other region 30 on the side where the center point 12a is not included, and can therefore easily remove the foreign matter adhering to the protective cover 12 by driving the protective cover 12.

The optical device includes curved portions, such as the boundary lines 20b and 21b and the boundary lines 20c and 21c. However, the configuration is not limited to the case that all portions are defined by curved lines as in the boundary lines 20b and 21b and the boundary lines 20c and 21c, and the boundary line may partially include a curved portion. The optical device may include straight lines such as the boundary lines 22b and 23b and the boundary lines 22c and 23c. The optical device may have an acute angle such as the angle on the side where the center point 12a is not included of the angles defined by the boundary lines 20b and 22b and the boundary lines 20c and 22c at the starting points 20a and 22a, respectively. The optical device may have an obtuse angle such as the angle on the side where the center point 12a is not included of the angles defined by the boundary line 21b and the boundary line 21c at the starting point 21a. Two right angles, such as the angle on the side where the center point 12a is not included of the angles defined by the boundary line 23b and the boundary line 23c at the starting point 23a, may be provided.

The optical unit 100 includes the optical sensor 1 and the optical device 10 described above. With this configuration, since the protective cover 12 is provided with the region 20, the optical unit 100 can easily remove the foreign matter adhering to the protective cover 12 by driving the protective cover 12.

The protective cover 12 includes the inner circumferential portion 12b corresponding to the visual field of the optical sensor 1, and the outer circumferential portion provided in the outer side portion of the inner circumferential portion 12b. With the starting point 20a being located between the center point 12a and the inner circumferential portion 12b, since a portion of the region 20 having high hydrophobicity is provided in the inner circumferential portion 12b, the water droplet on the inner circumferential portion 12b can be made to flow to the outside (outer circumferential portion) of the visual field region (inner circumferential portion 12b) of the protective cover 12.

Preferred Embodiment 2

In the optical device according to Preferred Embodiment 1, the configuration in which the region 20 (second region) having higher hydrophobicity than the other region 30 (first region) is provided on the protective cover 12 has been described. In an optical device according to Preferred Embodiment 2 of the present invention, a configuration in which another region (third region) is provided on the protective cover 12 will be described.

Figure 5A:
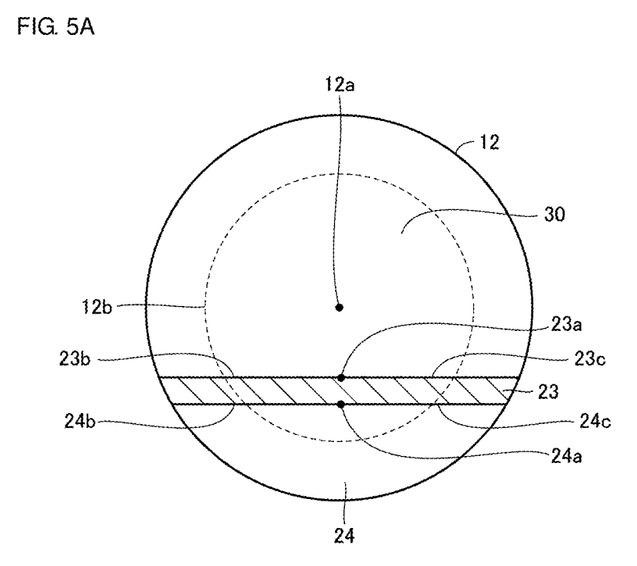
FIGS. 5A and 5B are plan views illustrating a region having different hydrophobicity provided on a protective cover according to Preferred Embodiment 2 of the present invention.
Figure 5B:
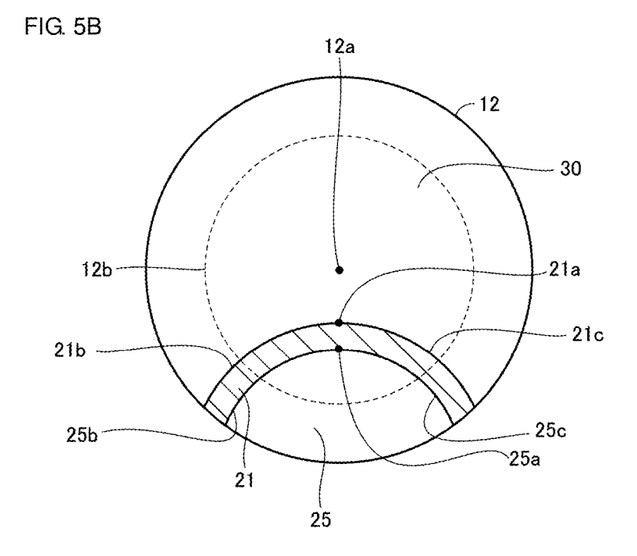

FIGS. 5A and 5B are plan views illustrating a region having different hydrophobicity provided on a protective cover according to Preferred Embodiment 2. Note that the optical unit according to Preferred Embodiment 2 has the same or substantially the same configurations as the optical unit 100 illustrated in FIG. 1 except for the region having different hydrophobicity provided on the protective cover, and the same or substantially the same configurations are denoted by the same reference numerals and detailed description thereof will not be repeated. Furthermore, the optical device according to Preferred Embodiment 2 has the same or substantially the same configurations as the optical device 10 illustrated in FIG. 1 except for the region having different hydrophobicity provided on the protective cover, and the same or substantially the same configurations are denoted by the same reference numerals and detailed description thereof will not be repeated.

In FIG. 5A, the outer surface of the protective cover 12 is further provided with a region 24 (third region) having lower hydrophobicity than the region 23 having high hydrophobicity illustrated in FIG. 4B. The region 24 is a region which is separated from the region 23 by a boundary line 24b (third boundary line) extending from a starting point 24a (second starting point) provided in the region 23 (including a boundary with the region 23) in the direction toward the outer edge portion of the protective cover 12 and a boundary line 24c (fourth boundary line) extending from the starting point 24a in the direction toward the outer edge portion of the protective cover 12, and which is located on the side where the center point 12a is not included. The boundary line 23b and the boundary line 23c are parallel or substantially parallel to the boundary line 24b and the boundary line 24c.

The region 24 may have lower hydrophobicity than the region 23, and may have the same hydrophobicity as that of the other region 30. That is, in the protective cover 12, only the region 23 may be coated with a material having high hydrophobicity, or the other region 30 and the region 24 may be coated with a material having high hydrophilicity. Furthermore, as long as hydrophobicity is lower than that of the region 23, the region 24 may have different hydrophobicity from that of the other region 30. For example, the regions may be coated such that the hydrophobicity increases in the order of the other region 30, the region 24, and the region 23.

In the region 23 illustrated in FIG. 5A, the boundary lines of the other region 30 and the region 24 are defined by two straight lines, and the straight lines are in a parallel or substantially parallel relationship. Although the width of the region 23 is preferably as narrow as possible in order to ensure the visibility of the optical sensor 1, if the width is too narrow, the water droplet crosses the region 23, and thus a certain degree of width is required. Furthermore, the region 23 has a boundary with the region 24 having different hydrophobicity in the outer side portion relative to the boundary between the region 23 and the other region 30. That is, the region 24 is not coated with a material having high hydrophobicity in the inner side portion of the region 23.

The configuration in which the region having low hydrophobicity is provided in the inner side portion of the region having high hydrophobicity is not limited to that in FIG. 5A and, as illustrated in FIG. 5B, a region 25 (third region) having lower hydrophobicity than the region 21 having high hydrophobicity illustrated in FIG. 3 may further be provided. The region 25 is separated from the region 21 by a boundary line 25b (third boundary line) extending from a starting point 25a (second starting point) provided in the region 21 in the direction toward the outer edge portion of the protective cover 12 and a boundary line 25c (fourth boundary line) extending from the starting point 25a in the direction toward the outer edge portion of the protective cover 12, and which is located on the side where the center point 12a is not included. The boundary line 21b and the boundary line 21c are parallel or substantially parallel to the boundary line 25b and the boundary line 25c.

The region 25 may have lower hydrophobicity than the region 21, and may have the same hydrophobicity as that of the other region 30. That is, in the protective cover 12, only the region 21 may be coated with a material having high hydrophobicity, or the other region 30 and the region 25 may be coated with a material having high hydrophilicity. Furthermore, as long as hydrophobicity is lower than that of the region 21, the region 25 may have different hydrophobicity from that of the other region 30. For example, the regions may be coated such that the hydrophobicity increases in the order of the other region 30, the region 25, and the region 21.

Figure 6A:
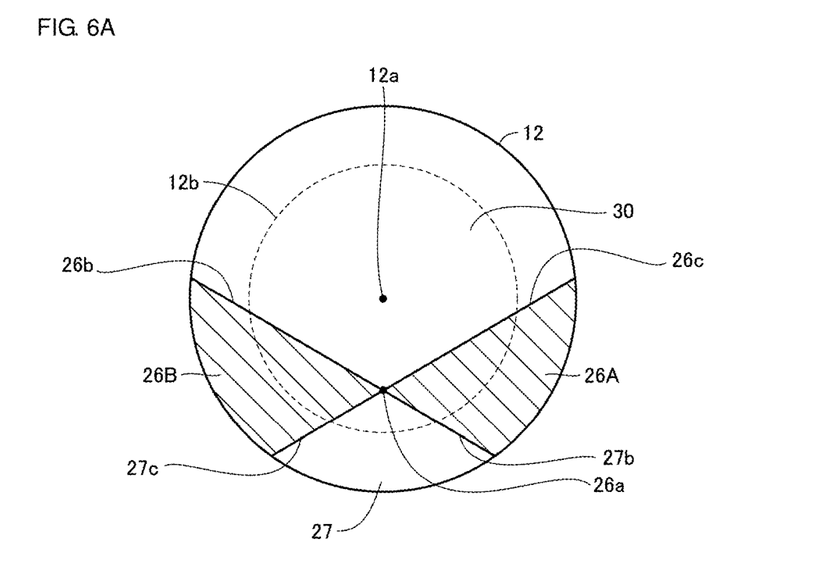
FIGS. 6A and 6B are plan views illustrating a region of another shape having different hydrophobicity provided on the protective cover according to Preferred Embodiment 2 of the present invention.
Figure 6B:
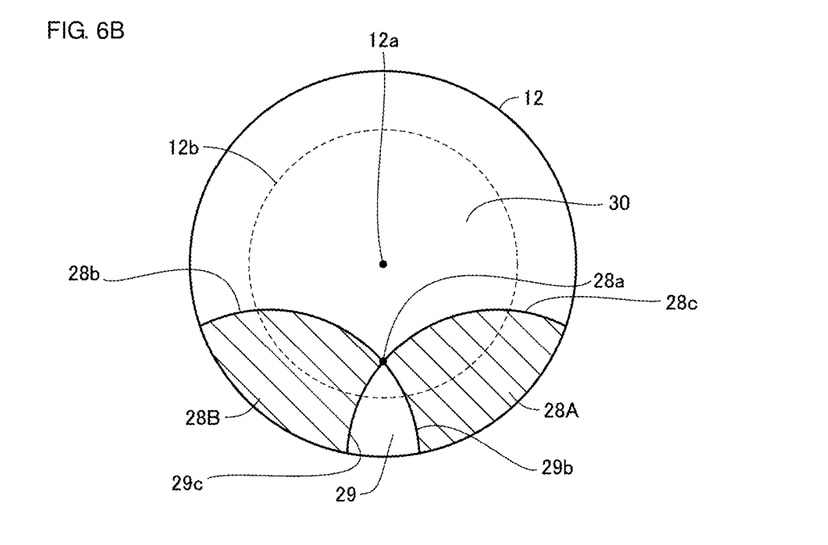

It has been described that the boundary line 23b and the boundary line 23c are parallel or substantially parallel to the boundary line 24b and the boundary line 24c in FIG. 5A, and the boundary line 21b and the boundary line 21c are parallel or substantially parallel to the boundary line 25b and the boundary line 25c in FIG. 5B. However, the boundary line between the first region and the second region and the boundary line between the second region and the third region need not be parallel or substantially parallel to each other, and may intersect with each other. FIGS. 6A and 6B is a plan view illustrating a region of another shape having different hydrophobicity provided on the protective cover according to Preferred Embodiment 2.

In FIG. 6A, the surface of the protective cover 12 is provided with regions 26A and 26B (second regions) having higher hydrophobicity than the other region 30 (first region). These regions 26A and 26B are separated from the other region 30 by a boundary line 26b (first boundary line) extending from a starting point 26a deviating from the center point 12a (rotation center) of the protective cover 12 in the direction toward the outer edge portion of the protective cover 12 and a boundary line 26c (second boundary line) extending from the starting point 26a in the direction toward the outer edge portion of the protective cover 12, and which are located on the side where the center point 12a is not included. Note that, among angles defined by the boundary line 26b and the boundary line 26c, the angle on the side where the center point 12a is not included need not be equal to or less than about 180°, and it is sufficient that, of the angles defined by the boundary line 26b and the boundary line 26c, the angle on the side where the center point 12a is not included is less than four right angles.

Furthermore, in FIG. 6A, a region 27 (third region) having lower hydrophobicity than the regions 26A and 26B having high hydrophobicity is further provided. The region 27 is separated from the regions 26A and 26B by a boundary line 27b (third boundary line) extending from the same starting point 26a as that of the regions 26A and 26B in the direction toward the outer edge portion of the protective cover 12 and a boundary line 27c (fourth boundary line) extending from the starting point 26a in the direction toward the outer edge portion of the protective cover 12, and which is located on the side where the center point 12a is not included.

Note that the starting point (second starting point) of the region 27 coincides with the starting point 26a (first starting point) of the regions 26A and 26B. Accordingly, the boundary line 26b and the boundary line 26c are not parallel or substantially parallel to but intersect with the boundary line 27b and the boundary line 27c. In particular, in FIG. 6A, the boundary line 27b (third boundary line) is located on a line obtained by extending the boundary line 26b (first boundary line), and the boundary line 27c (fourth boundary line) is located on a line obtained by extending the boundary line 26c (second boundary line).

Furthermore, it can also be described that the region 26A is separated by the boundary line 26c and the boundary line 27b, and the region 26B is separated by the boundary line 26b and the boundary line 27c. Furthermore, it can also be described that the two regions 23 having high hydrophobicity illustrated in FIG. 4B are provided on the outer surface of the protective cover 12, and the two regions partially overlap with each other. Note that the region where the two regions partially overlap with each other is defined as the region 27, and the regions where the two regions do not overlap with each other are respectively defined as the regions 26A and 26B.

The region 27 may have lower hydrophobicity than the regions 26A and 26B, and may have the same hydrophobicity as that of the other region 30. That is, in the protective cover 12, only the regions 26A and 26B may be coated with a material having high hydrophobicity, or the other region 30 and the region 27 may be coated with a material having high hydrophilicity. Furthermore, as long as hydrophobicity is lower than those of the regions 26A and 26B, the region 27 may have different hydrophobicity from that of the other region 30. For example, the regions may be coated such that the hydrophobicity increases in the order of the other region 30, the region 27, and the regions 26A and 26B.

Furthermore, in FIG. 6A, the boundary line 26c of the region 26a and the boundary line 26b of the region 26b intersect with each other at the starting point 26a, and regions on a straight line passing through the starting point 26a (intersection point) and the center point 12a of the protective cover 12 have high hydrophilicity. In the case where the boundary lines 26b and 26c are defined by two straight lines not in a parallel or substantially parallel relationship, a region where the water droplets can be collected widens, and it is possible to more efficiently remove the water droplets. However, in this case, it is necessary to provide the region 27 extending from the starting point 26a toward the outer edge portion of the protective cover 12 as a region having higher hydrophilicity than those of the regions 26A and 26B. This is because it is necessary to move the water droplets collected to the starting point 26a to the outer edge portion of the protective cover 12 after passing over the starting point 26a.

The boundary line with the other region 30 is not limited to a straight line, and may be a curved line. In FIG. 6B, the surface of the protective cover 12 is provided with regions 28A and 28B (second regions) having higher hydrophobicity than the other region 30 (first region). These regions 28A and 28B are separated from the other region 30 by a curved boundary line 28b (first boundary line) extending from a starting point 28a deviating from the center point 12a (rotation center) of the protective cover 12 in the direction toward the outer edge portion of the protective cover 12 and a curved boundary line 28c (second boundary line) extending from the starting point 28a in the direction toward the outer edge portion of the protective cover 12, and which are located on the side where the center point 12a is not included. Note that, among angles defined by the boundary line 28b and the boundary line 28c, the angle on the side where the center point 12a is not included need not be equal to or less than about 180°, and it is sufficient that, of the angles defined by the boundary line 28b and the boundary line 28c, the angle on the side where the center point 12a is not included is less than four right angles.

Furthermore, in FIG. 6B, a region 29 (third region) having lower hydrophobicity than the regions 28A and 28B having high hydrophobicity is further provided. The region 29 is separated from the regions 28A and 28B by a curved boundary line 29b (third boundary line) extending from the same starting point 28a as that of the regions 28A and 28B in the direction toward the outer edge portion of the protective cover 12 and a curved boundary line 29c (fourth boundary line) extending from the starting point 28a in the direction toward the outer edge portion of the protective cover 12, and which is located on the side where the center point 12a is not included.

Note that the starting point (second starting point) of the region 29 coincides with the starting point 28a (first starting point) of the regions 28A and 28B. Accordingly, the boundary line 28b and the boundary line 28c are not parallel or substantially parallel, but instead, intersect with the boundary line 29b and the boundary line 29c. In particular, in FIG. 6B, the boundary line 29b (third boundary line) is located on a line obtained by extending the boundary line 28b (first boundary line), and the boundary line 29c (fourth boundary line) is located on a line obtained by extending the boundary line 28c (second boundary line).

Furthermore, it can also be described that the region 28A is separated by the boundary line 28c and the boundary line 29b, and the region 28B is separated by the boundary line 28b and the boundary line 29c. Furthermore, it can also be described that the two regions 21 having high hydrophobicity illustrated in FIG. 3 are provided on the outer surface of the protective cover 12, and the two regions partially overlap with each other. Note that the region where the two regions partially overlap with each other is defined as the region 29, and the regions where the two regions do not overlap with each other are respectively defined as the regions 28A and 28B.

The region 29 may have lower hydrophobicity than the regions 28A and 28B, and may have the same hydrophobicity as that of the other region 30. That is, in the protective cover 12, only the regions 28A and 28B may be coated with a material having high hydrophobicity, or the other region 30 and the region 29 may be coated with a material having high hydrophilicity. Furthermore, as long as hydrophobicity is lower than those of the regions 28A and 28B, the region 29 may have different hydrophobicity from that of the other region 30. For example, the regions may be coated such that the hydrophobicity increases in the order of the other region 30, the region 29, and the regions 28A and 28B.

As described above, the optical device according to Preferred Embodiment 2 includes the protective cover 12 disposed in the visual field direction of the optical sensor 1, and the driver 13 that rotationally drives the protective cover 12 with the center of the visual field of the optical sensor 1 as an axis. The outer surface of the protective cover 12 is provided with the regions 23 and 21 (second regions) having higher hydrophobicity than the other region 30 (first region), and the regions 24 and 25 (third regions) having lower hydrophobicity than the regions 23 and 21. The regions 23 and 21 are respectively separated from the other region 30 by the boundary lines 23b and 21b (first boundary lines) respectively extending from the starting points 23a and 21a (first starting points) deviating from the center point 12a (rotation center) of the protective cover 12 in the direction toward the outer edge portion of the protective cover 12 and the boundary lines 23c and 21c (second boundary lines) respectively extending from the starting points 23a and 21a in the direction toward the outer edge portion of the protective cover 12, and which are located on the side where the center point 12a is not included. The regions 24 and 25 are respectively separated from the regions 23 and 21 by the boundary lines 24b and 25b (third boundary lines) respectively extending from the starting points 24a and 25a (second starting points) provided in the regions 23 and 21 in the direction toward the outer edge portion of the protective cover 12 and the boundary lines 24c and 25c (fourth boundary lines) respectively extending from the starting points 24a and 25a in the direction toward the outer edge portion of the protective cover 12, and which are located on the side where the center point 12a is not included. Note that the boundary lines 23b and 23c, and 21b and 21c are parallel or substantially parallel to the boundary lines 24b and 24c, and 25b and 25c.

Accordingly, the optical device according to Preferred Embodiment 2 is provided with the regions 24 and 25 which are separated by the boundary lines 24b and 24c, and 25b and 25c and located on the side where the center point 12a is not included, and can therefore easily remove the foreign matter adhering to the protective cover 12 by driving the protective cover 12.

Furthermore, the outer surface of the protective cover is provided with the regions 26A and 26B, and 28A and 28B (second regions) having higher hydrophobicity than the other region 30 (first region), and the regions 27 and 29 (third regions) having lower hydrophobicity than the regions 26A and 26B, and 28A and 28B. The regions 26A and 26B, and 28A and 28B are respectively separated from the other region 30 by the boundary lines 26b and 28b (first boundary lines) respectively extending from the starting points 26a and 28a (first starting points) deviating from the center point 12a (rotation center) of the protective cover 12 in the direction toward the outer edge portion of the protective cover 12 and the boundary lines 26c and 28c (second boundary lines) respectively extending from the starting points 26a and 28a in the direction toward the outer edge portion of the protective cover 12, and which are located on the side where the center point 12a is not included. The regions 27 and 29 are separated from the regions 26A and 26B, and 28A and 28B by the boundary lines 27b and 29b (third boundary lines) respectively extending from the starting points 26a and 28a in the direction toward the outer edge portion of the protective cover 12 and the boundary lines 27c and 29c (fourth boundary lines) respectively extending from the starting points 26a and 28a in the direction toward the outer edge portion of the protective cover 12, and which are located on the side where the center point 12a is not included. Note that the second starting points of the regions 27 and 29 respectively coincide with the starting points 26a and 28a. The boundary lines 27b and 29b are respectively located on lines obtained by extending the boundary lines 26b and 28b, and the boundary lines 27c and 29c are respectively located on lines obtained by extending the boundary line 26c and 28c. The optical device according to Preferred Embodiment 2 may have a configuration in which the second starting points of the regions 27 and 29 do not respectively coincide with the starting points 26a and 28a. In addition, the optical device according to Preferred Embodiment 2 may have a configuration in which the boundary lines 27b and 29b are not respectively located on the lines obtained by extending the boundary lines 26b and 28b, and the boundary lines 27c and 29c are not respectively located on the lines obtained by extending the boundary lines 26c and 28c.

Accordingly, the optical device according to Preferred Embodiment 2 is provided with the regions 27 and 29 which are separated by the boundary lines 27b and 27c, and 29b and 29c and located on the side where the center point 12a is not included, and can therefore easily remove the foreign matter adhering to the protective cover 12 by driving the protective cover 12.

In the above-described examples, although it has been described that two regions having high hydrophobicity are provided on the protective cover 12, and the two regions partially overlap with each other, a plurality of three or more regions having high hydrophobicity may be provided on the protective cover 12, and the three or more regions may partially overlap with one another.

Figure 7:
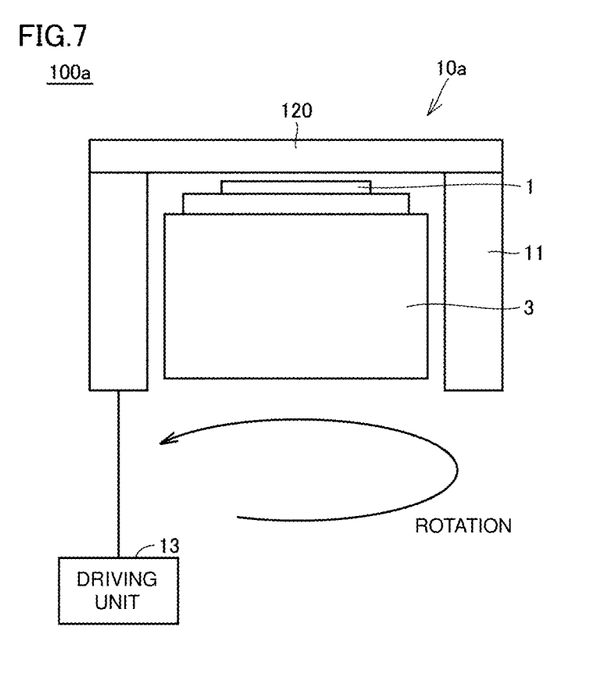
FIG. 7 is a schematic diagram for describing the configuration of an optical unit according to a modification of a preferred embodiment of the present invention.

In the optical device according to each of the above-described preferred embodiments, although it has been described that the protective cover 12 has a dome shape, a plate shape may be used. FIG. 7 is a schematic diagram for describing the configuration of an optical unit 100a according to a modification of a preferred embodiment of the present invention. The optical unit 100a includes the optical sensor 1 to acquire information such as a shape, a color, a temperature, and the like of an object and information such as a distance to the object or the like, and an optical device 10a that holds the optical sensor 1 and includes an optical member and the like to guide light to a sensor surface of the optical sensor 1. The optical device 10a includes the housing 11, a plate-shaped transparent protective cover 120 provided on one surface of the housing 11, and the driver 13 that rotates the protective cover 120. The optical unit 100a and the optical device 10a have the same or substantially the same configurations as the optical unit 100 and the optical device 10 illustrated in FIG. 1 except that the shape of the protective cover 120 is different, and the same or substantially the same configurations are denoted by the same reference numerals and detailed description thereof will not be repeated.

Figure 8A:
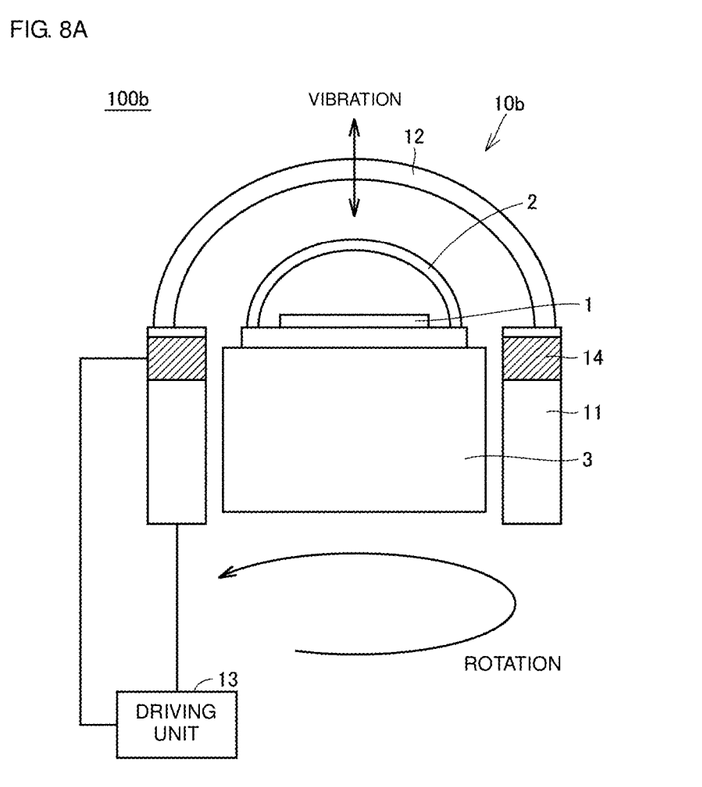
FIGS. 8A and 8B are schematic diagrams for describing the configuration of an optical unit according to another modification of a preferred embodiment of the present invention.
Figure 8B:
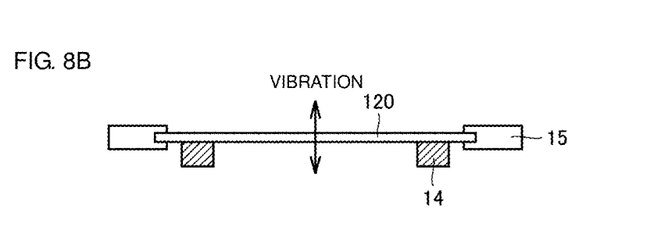

In the optical device according to each of the above-described preferred embodiments, although the rotation mechanism to rotate the protective cover has been described as a remover to remove the foreign matter adhering to the protective cover, the configuration is not limited thereto. As the remover, for example, a vibration body that vibrates the protective cover may be provided. FIGS. 8A and 8B are schematic diagrams for describing the configuration of an optical unit according to another modification of a preferred embodiment of the present invention. In FIG. 8A, a rotation mechanism to rotate the protective cover 12 (light-transmitting body) and a vibration body to vibrate the protective cover 12 are combined. Note that an optical unit 100b and an optical device 10b illustrated in FIG. 8A have the same or substantially the same configurations as the optical unit 100 and the optical device 10 illustrated in FIG. 1 except that the configuration to drive the protective cover is different, and the same or substantially the same configurations are denoted by the same reference numerals and detailed description thereof will not be repeated.

The optical device 10b includes the lens 2 that guides light to the sensor surface of the optical sensor 1, the holding portion 3 that holds the optical sensor 1 and the lens 2, the housing 11, the transparent protective cover (light-transmitting body) 12 that is provided on one surface of the housing 11 and located in an outer side portion of the lens 2, the driver 13 that rotates the protective cover 12, and a vibration body 14 that vibrates the housing 11. The driver 13 includes a motor (not illustrated), rotates the protective cover 12 with respect to the holding portion 3 by driving the housing 11 with the motor, and supplies a driving signal to the vibration body 14 to vibrate the protective cover 12.

The vibration body 14 has, for example, a cylindrical or substantially cylindrical shape, and is a piezoelectric vibrator. The piezoelectric vibrator vibrates, for example, by polarization in the thickness direction. The piezoelectric vibrator is preferably made of PZT-based piezoelectric ceramics, for example. However, other piezoelectric ceramics, such as, for example, $(K, Na)NbO_3$ or the like, may be used. Furthermore, a piezoelectric single crystal, such as, for example, $LiTaO_3$ or the like, may be used.

FIG. 8B illustrates a configuration to vibrate the protective cover 120 of the flat plate, and the protective cover 120 is vibrated by providing the vibration body 14 on one surface of the protective cover 120 fixed to a fixing portion 15.

The configuration of the region having high hydrophobicity provided on the protective cover 12 according to each of the above-described preferred embodiments is not limited to the combination with the rotation mechanism to rotate the protective cover 12 (light-transmitting body), and can be combined with the driver (for example, the vibration body) capable of moving the foreign matter (for example, the water droplet) adhering to the surface of the protective cover 12.

The optical unit according to each of the above-described preferred embodiments may include a camera, LiDAR, Rader, and the like, for example.

The optical unit according to each of the above-described preferred embodiments is not limited to the optical unit provided in the vehicle, and can also be similarly applied to an optical unit for any application in which the protective cover 12 disposed in the visual field of the optical sensor is required to be cleaned.

A plurality of examples of the region having high hydrophobicity provided on the protective cover 12 according to the above-described preferred embodiments can be arbitrarily combined. By combining the plurality of examples, the ability to remove the water droplet adhering to the surface of the protective cover 12 is further improved.

As the remover, in addition to the rotation mechanism to rotate the protective cover 12, a mechanism to discharge a cleaning body (cleaning liquid, air, or the like, for example) by a discharge device and removing the foreign matter may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical device comprising:
    a light-transmitting body disposed in a direction of a visual field of an optical sensor; and
    a driver to rotationally drive the light-transmitting body along an axis in the visual field of the optical sensor; wherein
    a first region and a second region having higher hydrophobicity than the first region are provided on an outer surface of the light-transmitting body;
    the second region is separated from the first region by a first boundary line extending from a first starting point deviating from a rotation center of the light-transmitting body in a direction toward an outer edge portion of the light-transmitting body and a second boundary line extending from the first starting point in a direction toward the outer edge portion of the light-transmitting body, and is located on a side where the rotation center is not included; and
    among angles defined by the first boundary line and the second boundary line, an angle on the side where the rotation center is not included is equal to or less than about 180°.

2. The optical device according to claim 1, wherein the first boundary line and the second boundary line each include a curved portion.

3. The optical device according to claim 1, wherein the first boundary line and the second boundary line are each a straight line.

4. The optical device according to claim 1, wherein the angle on the side where the rotation center is not included of the angles defined by the first boundary line and the second boundary line at the first starting point is an acute angle.

5. The optical device according to claim 1, wherein the angle on the side where the rotation center is not included of the angles defined by the first boundary line and the second boundary line at the first starting point is an obtuse angle or two right angles.

6. The optical device according to claim 1, wherein
    the light-transmitting body includes an inner circumferential portion that corresponds to the visual field of the optical sensor and an outer circumferential portion that is provided in an outer side portion of the inner circumferential portion; and
    the second region is provided in at least a portion of the inner circumferential portion.

7. An optical unit comprising:
    an optical sensor; and
    the optical device according to claim 1.

8. The optical unit according to claim 7, wherein the first boundary line and the second boundary line each include a curved portion.

9. The optical unit according to claim 7, wherein the first boundary line and the second boundary line are each a straight line.

10. The optical unit according to claim 7, wherein the angle on the side where the rotation center is not included of the angles defined by the first boundary line and the second boundary line at the first starting point is an acute angle.

11. The optical unit according to claim 7, wherein the angle on the side where the rotation center is not included of the angles defined by the first boundary line and the second boundary line at the first starting point is an obtuse angle or two right angles.

12. An optical device comprising:
    a light-transmitting body disposed in a direction of a visual field of an optical sensor; and
    a driver to rotationally drive the light-transmitting body along an axis in the visual field of the optical sensor; wherein
    a first region, a second region having higher hydrophobicity than the first region, and a third region having lower hydrophobicity than the second region are provided on an outer surface of the light-transmitting body;
    the second region is separated from the first region by a first boundary line extending from a first starting point deviating from a rotation center of the light-transmitting body in a direction toward an outer edge portion of the light-transmitting body and a second boundary line extending from the first starting point in a direction toward the outer edge portion of the light-transmitting body, and is located on a side where the rotation center is not included; and
    the third region is separated from the second region by a third boundary line extending from a second starting point provided in the second region in a direction toward an outer edge portion of the light-transmitting body and a fourth boundary line extending from the second starting point in a direction toward the outer edge portion of the light-transmitting body, and is located on a side where the rotation center is not included.

13. The optical device according to claim 12, wherein the first boundary line and the second boundary line are parallel or substantially parallel to the third boundary line and the fourth boundary line.

14. The optical device according to claim 12, wherein the second starting point coincides with the first starting point.

15. The optical device according to claim 12, wherein
the third boundary line is located on a line obtained by extending the first boundary line; and
the fourth boundary line is located on a line obtained by extending the second boundary line.

16. The optical device according to claim 12, wherein
the light-transmitting body includes an inner circumferential portion that corresponds to the visual field of the optical sensor and an outer circumferential portion that is provided in an outer side portion of the inner circumferential portion; and
the second region is provided in at least a portion of the inner circumferential portion.

17. An optical unit comprising:
an optical sensor; and
the optical device according to claim 6.

18. The optical unit according to claim 17, wherein the first boundary line and the second boundary line are parallel or substantially parallel to the third boundary line and the fourth boundary line.

19. The optical unit according to claim 17, wherein the second starting point coincides with the first starting point.

20. The optical unit according to claim 17, wherein
the third boundary line is located on a line obtained by extending the first boundary line; and
the fourth boundary line is located on a line obtained by extending the second boundary line.

\* \* \* \* \*